United States Patent [19]

Molaire

[11] 4,322,490

[45] Mar. 30, 1982

[54] PHOTOPOLYMERIZABLE COMPOSITIONS FEATURING IMPROVED MONOMERS

[75] Inventor: Michel F. Molaire, Rochester, N.Y.

[73] Assignee: Eastman Kodak Company, Rochester, N.Y.

[21] Appl. No.: 207,819

[22] Filed: Nov. 17, 1980

[51] Int. Cl.³ .............................................. G03C 1/68
[52] U.S. Cl. .............................. 430/281; 204/159.16; 204/159.15; 204/159.19; 430/286; 430/288; 430/905
[58] Field of Search ............... 430/281, 286, 287, 288, 430/905, 906; 204/159.15, 159.16, 159.19

[56] References Cited

U.S. PATENT DOCUMENTS 3,907,574 9/1975 Yonezawa et al. .................. 430/284
4,230,790 10/1980 Hill ....................................... 430/286

FOREIGN PATENT DOCUMENTS 2558531 7/1976 Fed. Rep. of Germany .
607888 9/1948 United Kingdom .
784611 10/1957 United Kingdom .

*Primary Examiner*—Jack P. Brammer
*Attorney, Agent, or Firm*—Dana M. Schmidt

[57] ABSTRACT

This invention comprises a photopolymerizable composition and a method of photopolymerizing said composition, said composition containing a monomer having a single acrylate substituent on a benzene ring. The resulting speed of the composition is superior to compositions wherein the monomer has more than one acrylate substituent on the ring.

8 Claims, 1 Drawing Figure

PHOTOPOLYMERIZABLE COMPOSITIONS FEATURING IMPROVED MONOMERS

INTRODUCTION (1) Field of the Invention

This invention relates to a light-sensitive polymerizable composition having a particularly preferred utility in imagewise reproductions.

(2) Background of the Invention

Specialized uses of light-sensitive compositions such as photoresists require a combination of properties. Not only must the resist composition be flexible and adhere well to the support, it must also have high-temperature resistance to be useful in semiconductor preparations that subject the resist to high temperatures. In addition, faster speeds are constantly being sought, to reduce the amount of exposure that is required to produce a given level of polymerization in the case of a negative-working resist. Considerable difficulties have been encountered in developing a resist that has all of these characteristics.

Negative-working light-sensitive compositions usually comprise a polymerizable monomer, a photoinitiator composition that photoactivates the polymerization of the monomer, and a polymeric binder. Representative examples of monomers that have been used in the past are esters of trimellitic acid, for example, those described in German OLS No. 2,558,531. Such esters, however, produce compositions that are reduced in speed compared to speeds available from this invention.

SUMMARY OF THE INVENTION

In accordance with the present invention, there is advantageously featured a light-sensitive polymerizable composition and method of photopolymerization which provide speeds superior to conventional compositions.

Such improved speeds are obtained without sacrificing other desired properties such as high temperature resistance.

In accord with one aspect of the invention, the aforesaid features are achieved by an improved light-sensitive polymerizable composition comprising a polymerizable monomer, a polymeric binder, and a photoinitiator composition. The improvement comprises the use of a speed-enhancing amount of a monomer having the structure

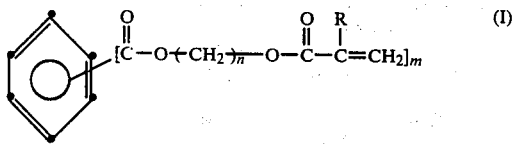

wherein R is hydrogen or alkyl of from 1 to 5 carbon atoms, m equals 1 and n is an integer of from 2 to 10.

Superior photopolymerization speeds are achieved, compared to a similar monomer wherein m is greater than 1, permitting exposure to activating radiation at lower intensities. Additional speed increases are obtained by heating the composition while it is exposed.

Other features of the invention will become apparent upon reference to the following Description of the Preferred Embodiments, when read in light of the attached drawing.

BRIEF DESCRIPTION OF THE DRAWING

The FIGURE is a graph of the speed of the composition against the concentration of monoacrylate, as defined herein.

DESCRIPTION OF THE PREFERRED EMBODIMENTS

Figure 1:
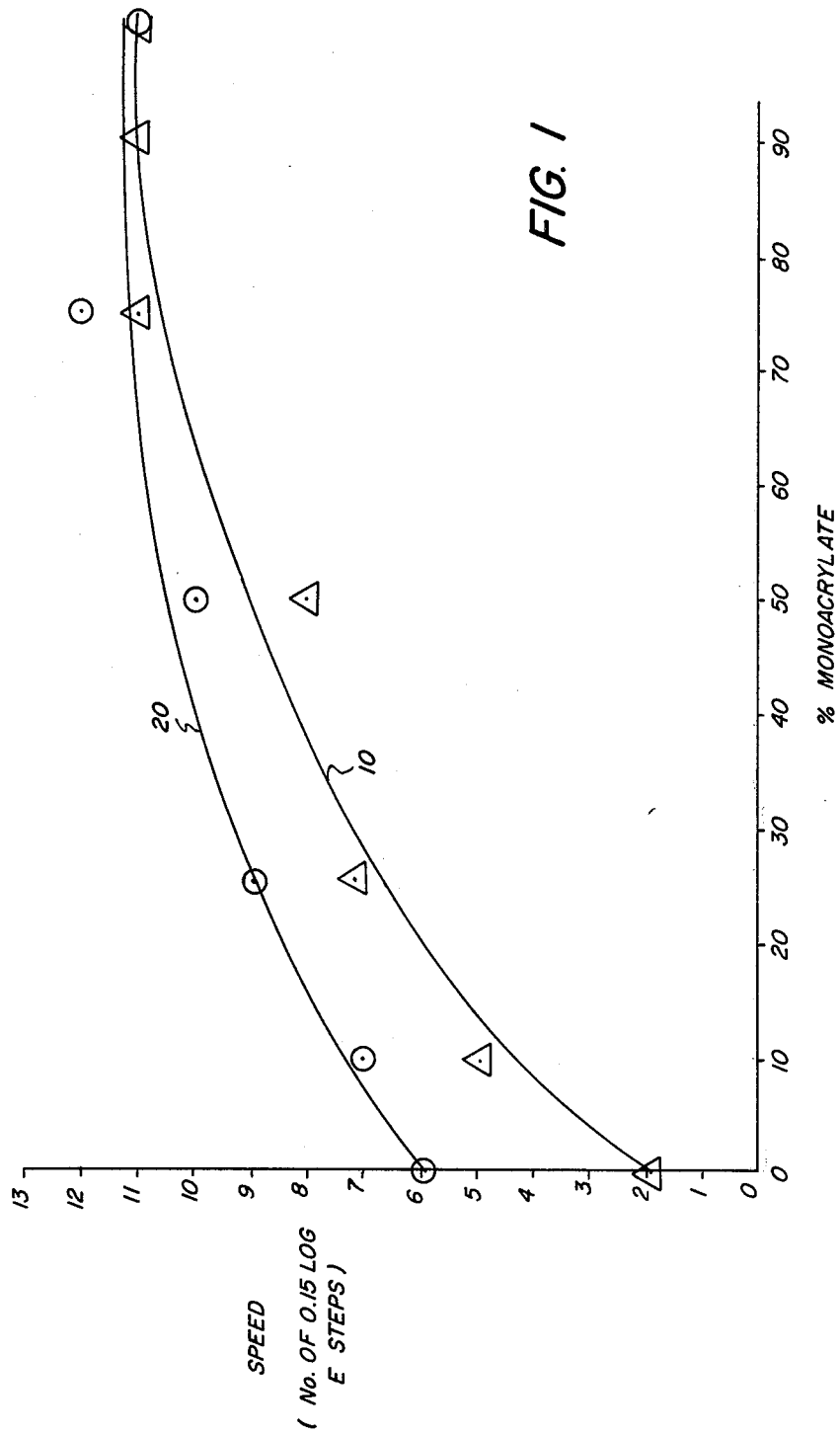

The invention is based in part upon the discovery that a monoacrylate ester of benzoic acid, as defined in the Summary, produces an enhanced speed in a photosensitive composition when the monoacrylate is selected to comprise at least a portion of the monomer of the photopolymerizable composition, compared to monomers selected from the higher acrylate esters such as the triacrylate. Detectable speed enhancements of at least 0.15 log E are produced by this invention, compared to the same composition wherein the monomer does not include the monoacrylate of the invention. As used herein, "monoacrylate" is understood to refer to an ester of benzoic acid, wherein only a single acrylate substituent is present. Although other acrylates, such as the triacrylate esters, can be included to form a mixture of monomers, preferred compositions are those in which at least 10%, by weight of the total monomer mixture, hereinafer simply "monomer," comprises the monoacrylate of the invention. Maximum speed improvements occur when greater than 50% of the weight of the monomer is the monoacrylate.

The improved polymerizable composition of this invention comprises the polymerizable monomer, a polymeric binder, and a photoinitiator in reactive association. Exposure to light radiation produces addition polymerization, in contrast to single-event crosslinking wherein a single photon creates only one crosslink event. "Addition polymerization" means a chain polymerization reaction wherein a single photon causes the addition of more than one recurring unit to a growing polymer. Without being limited to specific mechanisms, such addition polymerization preferably involves free-radical production.

In accordance with one aspect of the invention, the monomer is a compound having the structure delineated in the Summary. Examples of R in that structure include —H, —CH$_3$, and the like. In particularly preferred monoacrylates, n is 2, 3, 4, 5 or 6.

The following are particularly preferred specific monoacrylates: benzoyloxyethyl acrylate, benzoyloxypropyl acrylate, benzoyloxypentyl acrylate, benzoyloxybutyl acrylate, benzoyloxyhexyl acrylate, benzoyloxyethyl methacrylate, benzoyloxypropyl methacrylate, benzoyloxybutyl methacrylate, benzoyloxypentyl methacrylate and benzoyloxyhexyl methacrylate.

The monoacrylate monomers of the invention are synthesized using conventional procedures. The following preparation is illustrative.

PREPARATION OF HYDROXYALKYL ACRYLATE INTERMEDIATES: 6-HYDROXYHEXYL ACRYLATE

The following, although specific for 6-hydroxyhexyl acrylate, is the procedure that was used for the preparation of the hydroxyalkyl acrylate intermediates.

According to the method of G. A. Gareev and A. Makarov, *Zhurnal Organischeskoi Khimii*, Vol. 3, No. 6, p. 1000–1102, June 1967, 60.92 g (0.846 mole) of acrylic acid, 100 g (0.846 mole) of 1-hexanediol, 2.85 g (1.73 wt% of the reactants) of sulfuric acid and 0.66 g (1.08 wt% of acrylic acid) of α-nitroso-β-naphthol were mixed with 200 ml of benzene in a 500-ml flask fitted with a DeanStark trap and a reflux condenser. The mixture was refluxed overnight. In the morning, following cooling, neutralization with sodium carbonate, and filtration, the solution was distilled under vacuum (≈0.2 mm Hg). The product was collected between 100°–110° C., ≈60%. The NMR spectra were consistent with the assigned structure. The distilled product was inhibited with 0.15 wt% 3-t-butyl-4-hydroxy-5-methyl phenyl sulfide.

PREPARATION OF BENZOYLOXYALKYL ACRYLATES AND METHACRYLATES: 6-BENZOYLOXYHEXYL ACRYLATE

The following, although specific for 6-benzoyloxyhexyl acrylate is the general procedure that was used to prepare the benzoyloxyalkyl acrylates.

In a 1-liter, three-neck flask 56.51 g (0.323 mole) of 6-hydroxyhexyl acrylate and 36.53 g (0.36 mole) of triethylamine were dissolved in 200 ml of 1,2-dichloroethane. To this stirred solution, 46.13 g (0.32 mole) of benzoyl chloride in 100 ml of 1,2-dichloroethane was added dropwise. A positive pressure of nitrogen was used to keep moisture out of the system. After complete addition, the mixture was stirred for about 3 hrs.; then the resulting triethylamine hydrochloride salt was filtered off. The dichloroethane solution was then added dropwise to a 4% hydrochloric acid solution, while stirring magnetically. After complete addition, the aqueous layer was checked for acidity. The organic layer was again washed in the same manner with 2.5 liters of distilled water. After drying of the organic layer over magnesium sulfate, the solvent was evaporated under aspirate vacuum at ≈60° C.

Any polymeric binder is useful with the polymerizable monomer, if it provides the desired flexibility, adhesion, and high temperature resistance. Polyacrylates, polyamides, polycarbonates and polyesters are preferred to achieve properties desirable in photoresists.

Examples of useful polymeric binders known to have high temperature resistance include those wherein recurring units are selected from:

(A) Phenylindans such as the phenylindan dicarboxylates of U.S. Pat. No. 3,634,089; the phenylindan diols of Research Disclosure, Vol. 118, Item 11833, February, 1974, published by Industrial Opportunities Limited, Homewell, Havant Hampshire, PO9 1EF, United Kingdom; and U.S. Pat. Nos. 3,803,096; 3,859,364; and 3,886,124; the phenylindan diamines of U.S. Pat. Nos. 3,897,253 and 3,915,939 and the hydrogenated phenylindans of U.S. Pat. Nos. 3,769,264; 3,842,042; and 3,873,320;

(B) The polyester-amide precursors of J. C. Wilson, Research Disclosure, Vol. 128, Item 12833, December, 1974;

(C) The 1,1'-spirobiindan dicarboxylates of U.S. Pat. No. 3,725,070; and the 1,1'-spirobiindanbis(oxyacetates) of Research Disclosure, Vol. 98, Item 9830, June, 1972;

(D) The 1,1'-spirobiindan-5,5'-diamines of Research Disclosure, Vol. 131, Item 13117, March, 1975;

(E) The 2,2'-spirobichromans of U.S. Pat. No. 3,859,097;

(F) The 7,7-dimethyl-7H-dibenzo [c,h]xanthenes of U.S. Pat. Nos. 3,859,254 and 3,902,904;

(G) The 9,9-dimethylxanthene-3,6-bis(oxyacetates) of Research Disclosure, Vol. 98, Item 9830, June, 1972;

(H) The xanthylium salts of U.S. Pat. No. 3,856,751;

(I) The 4,4'-(3-phenyl-1-indanylidene)diphenols of Research Disclosure, Vol. 131, Item 13101, March, 1975;

(J) The 4,4'-(hexahydro-4,7-methanoindan-5-ylidene)diphenols of Research Disclosure, Vol. 135, Item 13568, July, 1975;

(K) The bisphenols of Research Disclosure, Vol. 120, Item 12012, April, 1974, and the halogenated bisphenols of Research Disclosure, Vol. 135, Item 13569, July, 1975;

(L) The sulfonyldibenzoates of Research Disclosure, Vol. 140, Item 14016;

(M) The polycyclic norbornanes of Research Disclosure, Vol. 92, Item 9207, December, 1971; and (N) The 1,2,3,4-tetrahydronaphthalenes of Research Disclosure, Vol. 135, Item 13570, July, 1975.

Polycarbonate binders are preferably prepared from bisphenols and phosgene. In order to obtain 1,1,1-trichloroethane solubility for processing, Bisphenol A is preferably copolymerized with other bisphenols, or less crystalline bisphenols are homopolymerized. The following are representative useful polycarbonates:

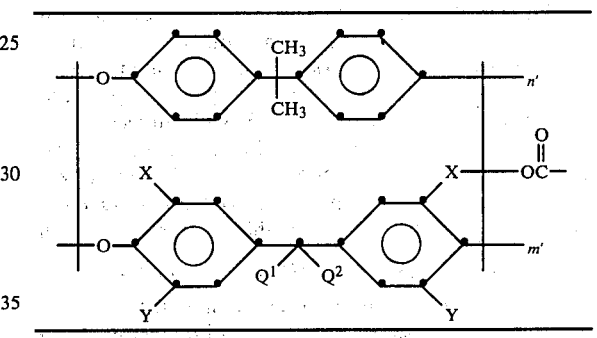

(a) For n' variable from 0 to 80 mole %, and m' variable from 20 to 100 mole %:

1: n' = m' = 50; $Q^1$ = $Q^2$ = —CH$_3$; X = Y = Cl
2: n' = m' = 50; $Q^1$ = CH$_3$, $Q^2$ = CH$_2$CH$_3$; X = Y = H
3: n' = 80; m' = 20; $Q^1$ = $Q^2$ = —CH$_3$; X = Y = Cl
4: n' = m' = 50; $Q^1Q^2$ = [structure]; X = Y = H 5: n' = m' = 50; $Q^1Q^2$ = [structure]; X = Y = H 6: n' = m' = 50; $Q^1$ = $Q^2$ = —CH$_3$; X = Y = CH$_3$
7: n' = m' = 50; $Q^1$ = $Q^2$ = —CH$_3$; X = H, Y = CH$_3$ (b) For n' = 0
1: $Q^1$ = $Q^2$ = —CH$_3$; X = Y = Cl
2: $Q^1$ = CH$_3$; $Q^2$ = CH$_2$CH$_3$; X = Y = H
3: $Q^1$ = $Q^2$ = —CH$_3$; X = Y = CH$_3$
4: $Q^1$ = $Q^2$ = —CH$_3$; X = H, Y = CH$_3$
5: $Q^1Q^2$ = [structure]; X = Y = H 6: $Q^1Q^2$ = [structure]; X = Y = H Polyester binders are prepared from a variety of diacids and diols. Solubility in 1,1,1-trichloroethane is obtained preferably by using alkyl-substituted aromatic diacids, aliphatic diacids, alkylene diols, alkyl-substituted bisphenols, halogenated bisphenols or bulky aliphatic bridged bisphenols. Phenylindandicarboxylic acid (PIDA) having the structure

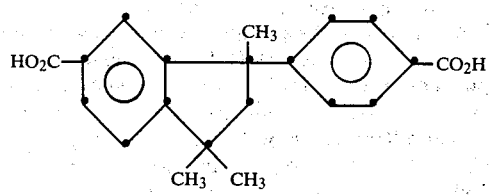

is particularly useful. The following are representative useful polyesters:

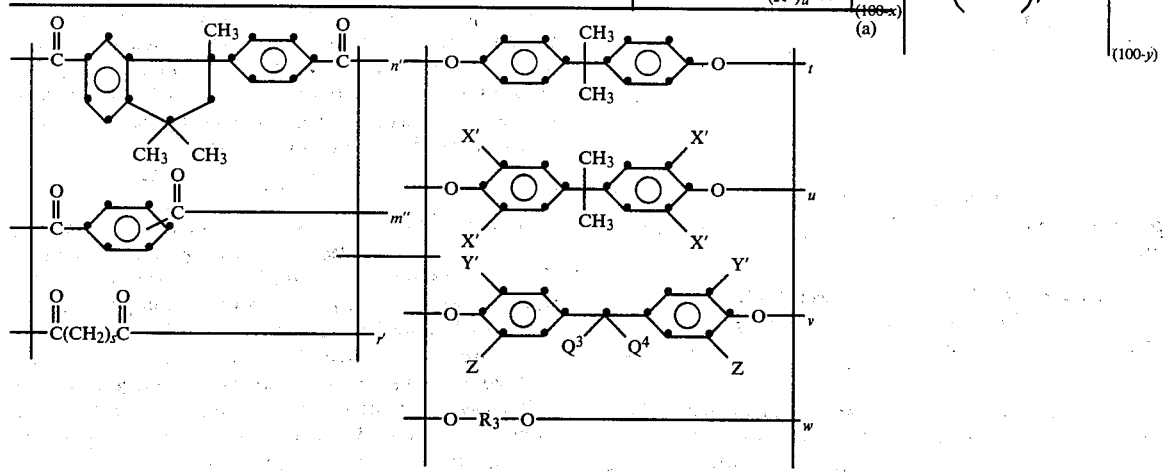

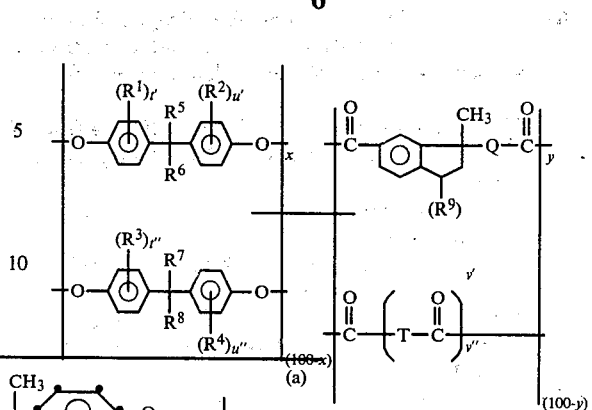

wherein the following have been used:
n" = 0–80 mole %,
m" = 0–50
r' = 20–60
t = 0 or 100
u = 0 or 100
v = 0 or 100
w = 0 or 100

X' = CH$_3$, OCH$_3$
Y' = CH$_3$, OCH$_3$
Z = H
Q$^1$ = Q$^2$ = —CH$_3$
Q$^1$ = CH$_3$ and Q$^4$ = CH$_2$CH$_3$ Q$^1$Q$^2$ = [structure], Q$^1$Q$^2$ = [structure], and; s = 3–8

(b)

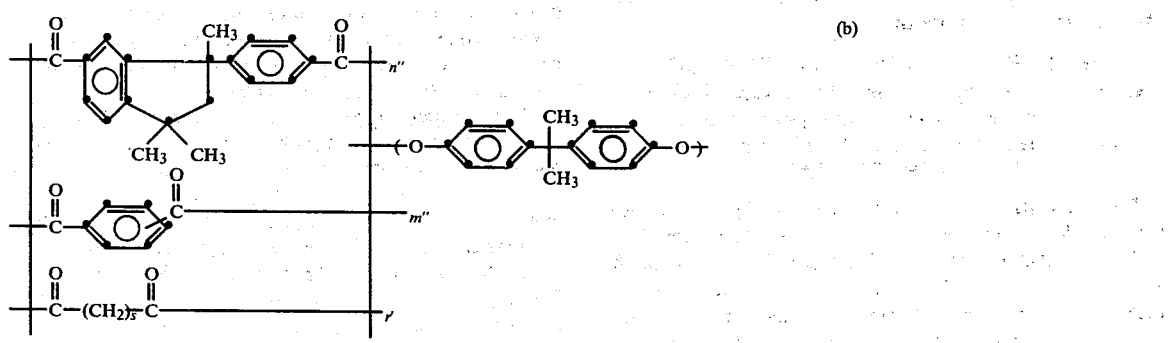

wherein the following have been used:
n" = 20–80 mole %
m" = 0–80
r' = 20–80,
n" = 40–80 } of which
m" = 0–60 } are preferred.
r' = 20–60

Of the binders described above, particularly preferred for their high temperature resistance are polymers having the structure wherein $R^1$, $R^2$, $R^3$, and $R^4$ are individually hydrogen; alkyl of from 1 to 3 carbon atoms, for example, methyl, ethyl and propyl; or halogen such as chlorine, fluorine;

$R^5$, $R^6$, $R^7$, $R^8$, and $R^9$ are individually alkyl of from 1 to 10 carbon atoms, such as methyl, ethyl, propyl, butyl and hexyl;

Q is arylene of from 6 to 10 carbon atoms, for example, phenylene or naphthalene;

T is alkylene of from 1 to 10 carbon atoms, such as methylene, ethylene, propylene, butylene, hexylene, and the like; or arylene as defined for Q;

t', t", u', u" and v' are individually the integer 1 or 2; v" is 1 or 0;

and x and y are mole percents such that $$0 \leq x \leq 50$$

$$0 \leq y \leq 80.$$

To further illustrate the method of preparing such polymeric binders, the following preparations are included:

PREPARATION 1-PREPARATION OF POLY[4,4'-isopropylidenediphenylene 1,1,3-trimethyl-3-phenylindan-5,4'-dicarboxylate:Azelate (70:30)]

A 500 ml polymer flask mounted with a stainless steel stirrer and a vacuum adapter was charged with 45.08 g (0.14 mole) of 5-carboxy-3-(4-carboxyphenyl)1,1,3-trimethylindan, 11.3 g (0.06 mole) azelaic acid and 62.47 g (0.20 mole) of 4,4'-isopropylidenediphenylene diacetate. A vacuum (13 mm Hg) was applied. The flask was then immersed in a salt bath held at 300° C.±3° C., while the mixture was stirred slowly. After approximately 10 min, acetic acid started to distill. After 1½ hrs. (mixture was clear and thick), the pressure was carefully decreased to approximately 0.15 mm Hg. The reaction was continued until stirring was difficult (about 45 min.). The polymer was isolated as a light yellow glass having a Tg of about 188° C.

PREPARATION 2-PREPARATION OF COPOLY[4,4'-isopropylidenediphenylene:4,4'-Isopropylidenebis(3,5-dichlorophenylene): 4,4'-Isopropylidenebis(3,5-dimethylphenylene) (20:20:60) TEREPHTHALATE]

This polyester was prepared from 14.21 g (0.07 mole) terephthaloyl chloride, 3.21 g (0.014 mole) Bisphenol A, 11.94 g (0.042 mole) 3,3',5,5'-tetramethylbisphenol A 5.12 g (0.014 mole) 3,3',5,5'-tetrachlorobisphenol A and 14.8 g of triethylamine. These materials were dissolved in 100 ml of dichloromethane in a dry 500 ml polymer flask. The reaction was allowed to continue for 3 hrs., at which time, the mixture was filtered over a sintered glass funnel to remove the undissolved triethylamine salt. After two water washes, the solution was precipitated in 3 liters of methanol in a Waring blender and the precipitated polymer was washed several times with methanol. The polymer was then dried overnight in a vacuum oven with a sweep of nitrogen at ≃100° C. It was found to have a Tg of about 239° C.

Any conventional photoinitiator composition is useful in this invention. Particularly preferred are the coinitiator compositions comprising Michler's ketone and benzophenone, and the 3-ketocoumarins described in U.S. Pat. No. 4,147,552, issued on Apr. 3, 1979. Water-soluble ketocoumarins are also useful.

The amount of the photoinitiator composition does not appear to be critical. Useful amounts include amounts between about 0.0002 and about 0.2 mmole per gram of drysolids content. Preferred amounts extend from about 0.001 to about 0.01 mmole per gram.

The amount of monomer is preferably between about 20 and about 45 weight % of the total dry solids.

Other ingredients are optionally added to the composition, for example, plasticizers, stabilizers, dyes and the like. The amounts are conventional and vary with the intended use.

Preferably, the composition of the invention is applied as a light-sensitive coating on a support to form an imaging element, at a dry thickness of between about 25 microns and about 100 microns. To apply the composition as a coating, various conventional techniques are useful. These include techniques such as spray-coating, whirler-coating, curtain-coating, roll-coating, and the like.

Any suitable solvent can be selected for preparing a dope of the composition to be coated on the support. Conventional developers are used to develop the image-wise-exposed coatings by removing non-polymerized, unexposed areas. Examples of useful solvents and developers include 1,1,1-trichloroethane, dichloromethane, acetone, benzene, alcohols, ethers, toluene and the like.

If a support for the composition is used, it is selected from a variety of known materials, including photographic supports. Thus, useful supports include polymeric film; wood fiber, e.g., a paper; metallic sheet and foil; glass; and ceramic supporting elements provided with one or more subbing layers to enhance the adhesive, antistatic, dimensional, abrasive, hardness, frictional, and/or other properties of the support surface which might be desired.

Useful polymeric film supports include films of cellulose nitrate and cellulose esters such as cellulose triacetate and diacetate, polystyrene, polyamides, homo- and copolymers of vinyl chloride, poly(vinyl acetal), polycarbonate, homo- and copolymers of olefins, such as polyethylene and polypropylene, and polyesters of dibasic aromatic carboxylic acids with divalent alcohols, such as poly(ethylene terephthalate).

Useful paper supports include those which are partially acetylated or coated with baryta and/or a polyolefin, particularly a polymer of an α-olefin containing 2 to 10 carbon atoms, such as polyethylene, polypropylene, copolymers of ethylene and propylene and the like.

Further details of useful supports are found in *Research Disclosure*, Vol. 176, Publication No. 17643, Para. XVII (December, 1978), published by Industrial Opportunities Ltd., Homewell, Havant, Hampshire, PO9 1EF, United Kingdom, the content of which is expressly incorporated herein by reference.

It is further contemplated that additional speed, that is, more density at a given exposure level, can be obtained by exposing an imaging element comprising the composition, at elevated temperatures, for example, 50 to 70° C.

The compositions of the invention have utility in a wide variety of applications. For example, one embodiment of the invention is an element comprising a metallic support bearing the composition of the invention, preferably along with a polymer binder. Particularly preferred metallic supports are copper foil. Such an element is useful in microelectronics and photofabrication, wherein the foil is etched into desired configurations. In such a use, the photopolymerizable composition of the invention, together with a compatible binder, acts as a negative resist which is exposed and developed to form, for example, annular-shaped spacers for beam leads which are etched out of the metal foil using a positive-working resist for the beam-lead portions of the metal. Certain examples of such use as a negative resist are described in U.S. Pat. No. 3,795,043, issued on Mar. 5, 1974, and more specifically in commonly owned U.S. Application Ser. No. 049,662, filed on June 18, 1979, by John Guild, entitled "Blank and Process for the Formation of Beam Leads for IC Chip Bonding". The details of the Guild application are incorporated herein by reference.

Additionally, the compositions prepared in accordance with the invention are useful as a lithographic printing plate composition, and as non-imaged polymerized coatings and other articles of manufacture.

EXAMPLES

The following examples are included for a further understanding of the invention.

EXAMPLES 1-6

To demonstrate the effect on speed of increasing the concentrations of the monoacrylate of the invention, the following dope composition was selected, wherein the monomer was a mixture of 2-benzoyloxyethyl acrylate, a monoacrylate of the invention, and the triacrylate counterpart, tris(2-acryloyloxyethyl)-1,3,5-benzenetricarboxylate. The percent stated in Table I is the weight percent which 2-benzoyloxyethyl acrylate comprised of the total monomer.

| Formulation | |
|---|---|
| Poly[4,4'-isopropylidenephenylene 1,1,3-trimethyl-3-phenylindan-5,4'-dicarboxylate: azelate (70:30)] | 4 g |
| Total monomer | 2.4 g |
| Benzophenone | 0.18 g |
| Michler's ketone | 0.03 g |
| Dichloromethane | 12 g |

The formulations were coated on 75-micron copper supports with a 300-micron coating knife. The coatings were baked at 18° C. for 5 min., at 38° C. for 5 min., at 66° C. for 5 min., and finally at 90° C. for 10 min in a circulating air oven. Th coatings were exposed through a Kodak T-14 Control Scale at room temperature in an exposure device available from Colight under the trade name "Xposer 1" for 3 min. Each additional step represents an increase of 0.15 log E. The speed results are shown in Table I.

TABLE I

| Example | % Monoacrylate in Monomer | No. of Speed Steps |
|---|---|---|
| Control | none | 2 |
| 1 | 10 | 5 |
| 2 | 25 | 11* |
| 2A | 25 | 7 |
| 3 | 50 | 8 |
| 4 | 75 | 11 |
| 5 | 90 | 11 |
| 6 | 100 | 11 |

*This high reading, which clearly is erroneous in light of the other data, appeared to have been caused by incomplete drying. Accordingly, the experiment was repeated as Ex. 2A and a more accurate reading of 7 was obtained.

The results appear as curve 10 in the drawing. Less than 10% of the monoacrylate was sufficient to produce a speed increase of at least 1 step (0.15 log E).

EXAMPLES 7-12

A DIFFERENT MONOACRYLATE

The procedure of Example 1 was repeated, using however the monomer mixture 6-benzoyloxyhexyl acrylate and 1,3-5-tris(6-acryloyloxyhexyl)-1,3,5-benzenetricarboxylate. The weight percent that 6-benzoyloxyhexyl acrylate comprised of this mixture is stated in Table II.

TABLE II

| Example | % Monoacrylate in Monomer | No. of Speed Steps |
|---|---|---|
| Control | none | 6 |
| 7 | 10 | 7 |
| 8 | 25 | 9 |
| 9 | 50 | 10 |
| 10 | 75 | 12 |
| 11 | 90 | 11 |
| 12 | 100 | 11 |

The results appear as curve 20 in the drawing.

EXAMPLES 13-15

OTHER POLYMERIC BINDERS

The procedure of Example 9 was repeated, using however the polymeric binders noted in Table III.

TABLE III

| Example | Polymeric Binder | No. of Speed Steps |
|---|---|---|
| 13 | Poly[4,4'-isopropylidenediphenylene 1,1,3-trimethyl-3-phenylindan-5,4'-dicarboxylate:Azelate](60:40) | 13 |
| 14 | Copoly[4,4'-isopropylidenediphenylene:4,4'-Isopropylidenebis(3,5-dichlorophenylene):4,4'-Isopropylidenebis(3,5-dimethylphenylene) (20:20:60) Terephthalate] | 2 |
| 15 | Poly(methyl methacrylate) obtained from Rohm & Haas under the trademark "Acryloid A-11" | 9 |

The poorer showing of Example 14 does not mean that this binder is a failure. Rather, it is presumed that higher exposure levels are required in general for this binder, and that if this binder were so exposed for a complete weight percent range of monoacrylate, including zero percent, the speed obtained for 50 weight percent monoacrylate would be markedly faster than the speed for zero percent monoacrylate.

EXAMPLE 16

ANOTHER MONOACRYLATE MONOMER

The procedure of Example 3 was repeated, using however the 50 weight percent monomer mixture of 3-benzoyloxypropyl acrylate and tris(3-acryloyloxypropyl)-1,3,5-benzenetricarboxylate. The number of speed steps was 5 to 6.

The invention has been described in detail with particular reference to preferred embodiments thereof, but it will be understood that variations and modifications can be effected within the spirit and scope of the invention.

What is claimed is:

1. In a light-sensitive polymerizable composition comprising a polymerizable monomer, a polymeric binder, and a photoinitiator composition; the improvement wherein said monomer comprises a speed-enhancing amount of a compound having the structure

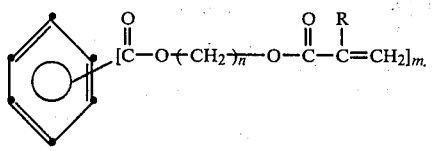

wherein R is hydrogen or alkyl of from 1 to 5 carbon atoms, m equals 1 and n is an integer of from 2 to 10.

2. A composition as defined in claim 1, wherein n is 2.

3. A composition as defined in claim 1 including, in an amount of less than 50 weight % of said monomer, a compound having said structure (I) wherein m equals 3.

4. A composition as defined in claim 1, 2 or 3, wherein said binder is selected from the group consisting of polyacrylates, polyamides, polycarbonates and polyesters.

5. A composition as defined in claim 4, wherein said binder is a polymer having a recurring unit represented by the chemical structure

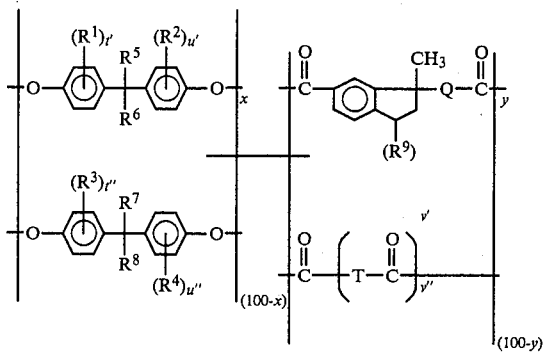

wherein $R^1$, $R^2$, $R^3$ and $R^4$ are individually hydrogen, alkyl of from 1 to 3 carbon atoms, or halogen;
$R^5$, $R^6$, $R^7$, $R^8$ and $R^9$ are individually alkyl of from 1 to 10 carbon atoms;
Q is arylene of from 6 to 10 carbon atoms;
T is alkylene of from 1 to 10 carbon atoms or arylene of from 6 to 10 carbon atoms;
t', t", u', u" and v' are individually the integers 1 or 2;
v" is 1 or 0;
and x and y are mole percents such that $0 \leq x \leq 50$ $0 \leq y \leq 80$.

6. A light-sensitive imaging element comprising a support having thereon a composition as defined in claim 1, 2 or 3.

7. A method of increasing the speed of a photopolymerization composition comprising a polymerizable monomer, a polymeric binder, and a photoinitiator composition;
said method comprising the step of adding to said monomer a compound having the structure

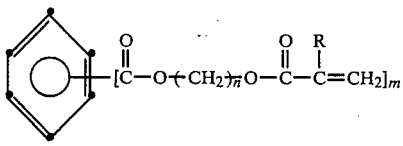

wherein R is hydrogen or alkyl of from 1 to 5 carbon atoms, m equals 1 and n is an integer of from 2 to 10,
said compound being present in a concentration sufficient to provide to said composition, when coated, dried and exposed to said radiation, an enhanced speed compared to the speed obtainable by the coated, dried and exposed from of the same composition wherein m is more than 1.

8. A method of photopolymerizing a composition comprising a polymeric binder, a photoinitiator composition, and as a polymerizable monomer, a compound having the structure.

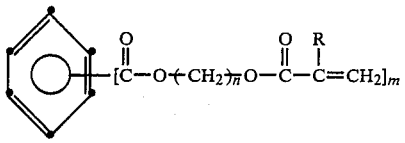

wherein R is hydrogen of alkyl of from 1 to 5 carbon atoms, m equals 1 and n is an integer of from 2 to 10,
said compound being present in a concentration sufficient to provide to said composition, when coated, dried and exposed to said radiation, an enhanced speed compared to the speed obtainable by the coated, dried and exposed from of the same composition wherein m is more than 1;
the method comprising the steps of
(a) imagewise exposing said composition to activating light radiation while heating it to a temperature of about 50° to 70° C.; and
(b) developing the exposed composition by removing the non-polymerized, unexposed areas.

* * * * *

UNITED STATES PATENT AND TRADEMARK OFFICE
CERTIFICATE OF CORRECTION

PATENT NO. : 4,322,490
DATED : March 30, 1982
INVENTOR(S) : Michel F. Molaire

It is certified that error appears in the above-identified patent and that said Letters Patent are hereby corrected as shown below:

Column 1, lines 51-56, the structure reading

" 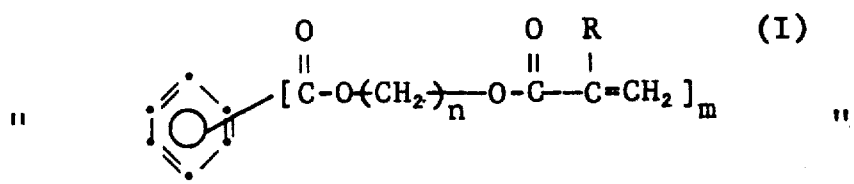 "

should read

--- 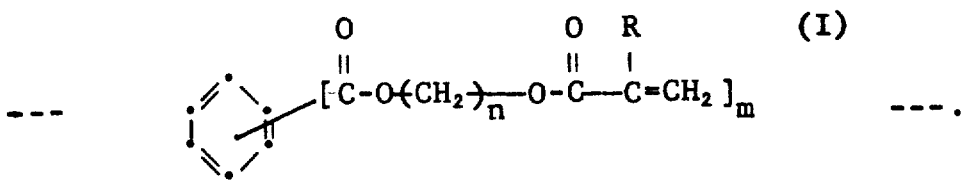 ---.

UNITED STATES PATENT AND TRADEMARK OFFICE
CERTIFICATE OF CORRECTION

PATENT NO. : 4,322,490
DATED : March 30, 1982
INVENTOR(S) : Michel F. Molaire

Page 2 of 7

It is certified that error appears in the above-identified patent and that said Letters Patent are hereby corrected as shown below:

Column 5, lines 43-54, the structure reading

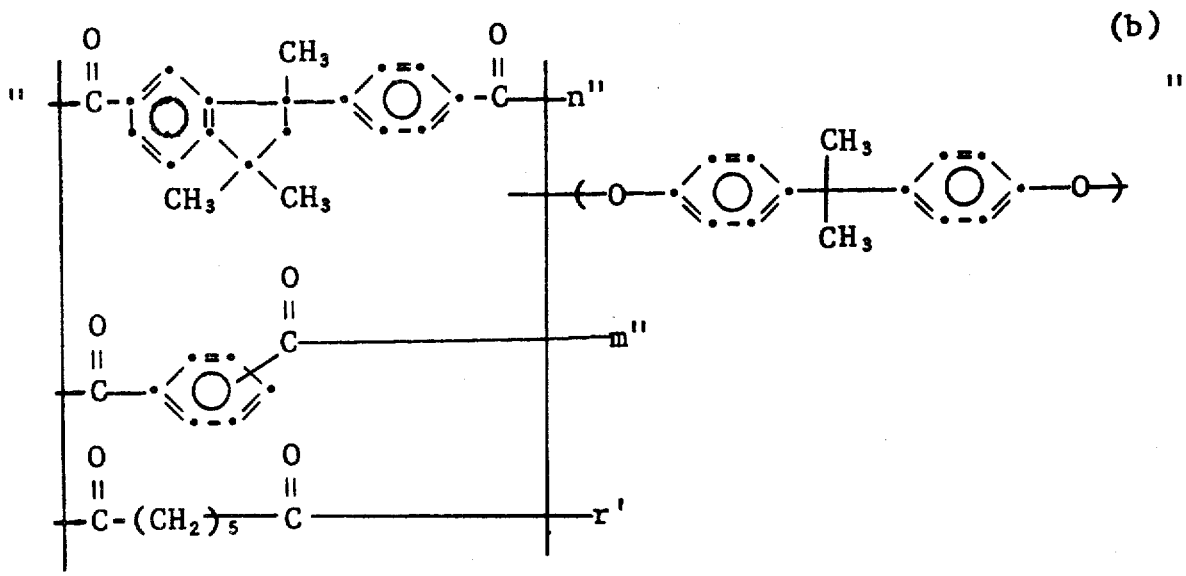

UNITED STATES PATENT AND TRADEMARK OFFICE
CERTIFICATE OF CORRECTION

PATENT NO. : 4,322,490  
DATED : March 30, 1982  
INVENTOR(S) : Michel F. Molaire Page 3 of 7

It is certified that error appears in the above-identified patent and that said Letters Patent are hereby corrected as shown below:

should read

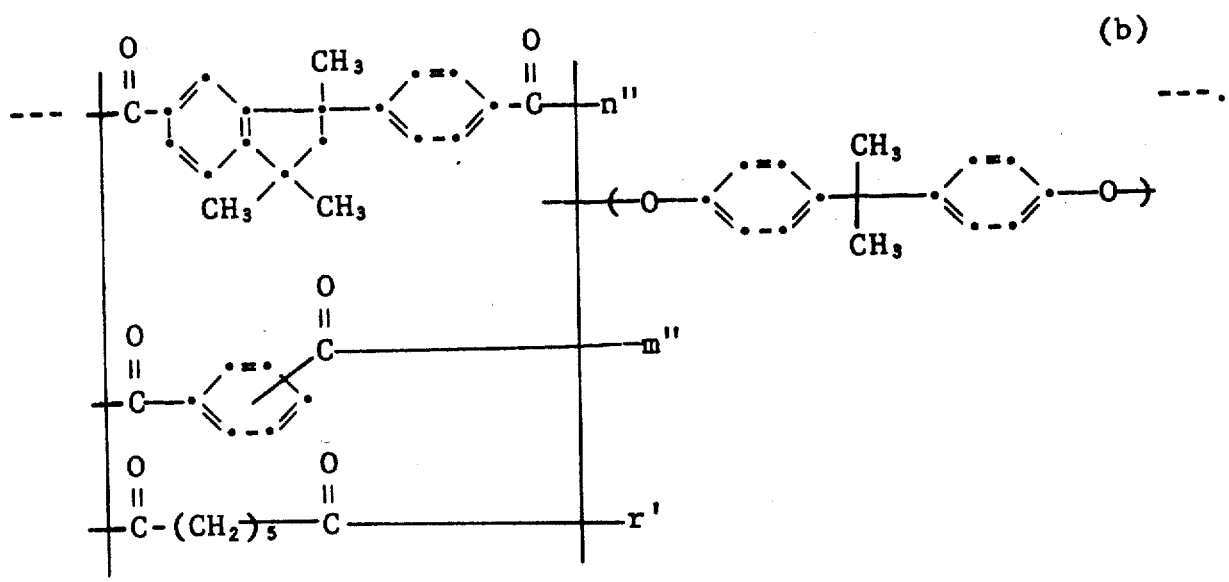

Column 8, line 6, "drysolids" should read --- dry-solids ---.

UNITED STATES PATENT AND TRADEMARK OFFICE
CERTIFICATE OF CORRECTION

PATENT NO. : 4,322,490

DATED : March 30, 1982

INVENTOR(S) : Michel F. Molaire

It is certified that error appears in the above-identified patent and that said Letters Patent are hereby corrected as shown below:

Column 9, line 38, that part of the formula reading "Poly[4,4'-isopropylidenephenylene" should read --- Poly[4,4'-isopropylidenediphenylene ---.

Column 10, line 39, after "idenebis(3,5-dimethylphenylene)" insert a "]"; line 40, "(20:20:60) Terephthalate]" should read --- Terephthalate (20:20:60) ---.

Column 11, lines 8-13, the structure reading

" 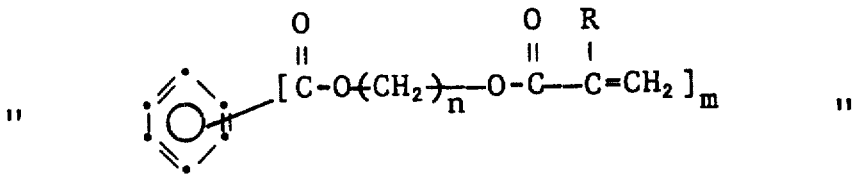 "

UNITED STATES PATENT AND TRADEMARK OFFICE
CERTIFICATE OF CORRECTION

PATENT NO. : 4,322,490
DATED : March 30, 1982
INVENTOR(S) : Michel F. Molaire

It is certified that error appears in the above-identified patent and that said Letters Patent are hereby corrected as shown below.

should read

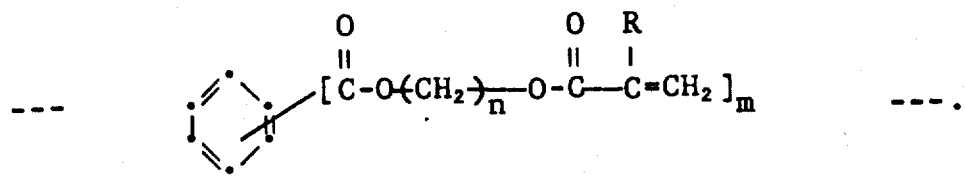

Column 12, lines 14-19, the structure reading

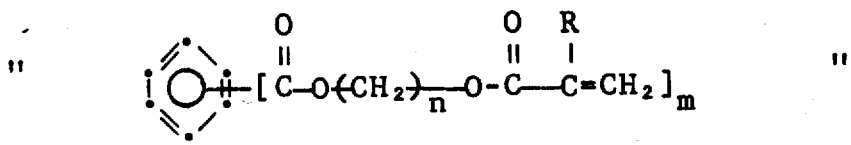

UNITED STATES PATENT AND TRADEMARK OFFICE
CERTIFICATE OF CORRECTION

PATENT NO. : 4,322,490

DATED : March 30, 1982

INVENTOR(S) : Michel F. Molaire

It is certified that error appears in the above-identified patent and that said Letters Patent are hereby corrected as shown below:

should read

" 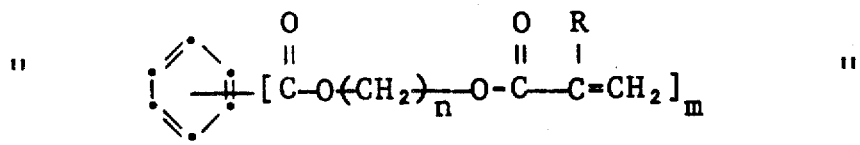 "

line 28, "from" should read ---form---; lines 36-40, the structure reading

" 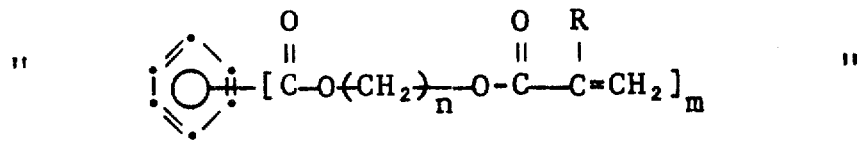 "

should read

UNITED STATES PATENT AND TRADEMARK OFFICE
CERTIFICATE OF CORRECTION

PATENT NO. : 4,322,490

DATED : March 30, 1982

INVENTOR(S) : Michel F. Molaire

It is certified that error appears in the above-identified patent and that said Letters Patent are hereby corrected as shown below:

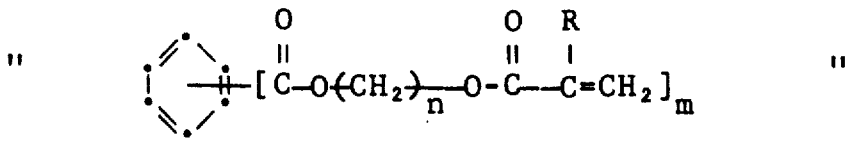

line 42, "of alkyl" should read ---or alkyl---;
line 48, "from" should read ---form---.

Signed and Sealed this

Seventh Day of February 1984

[SEAL]

Attest:

Attesting Officer

GERALD J. MOSSINGHOFF

Commissioner of Patents and Trademarks